United States Patent [19]
Eguchi et al.

[11] Patent Number: 6,013,899
[45] Date of Patent: Jan. 11, 2000

[54] METHOD AND APPARATUS FOR MOUNTING SOLDERING BALLS ONTO ELECTRODES OF A SUBSTRATE OR A COMPARABLE ELECTRONIC COMPONENT

[75] Inventors: Shigeru Eguchi; Teruaki Nishinaka, both of Fukuoka, Japan

[73] Assignee: Matsushita Electric Industrial Co., Ltd., Osaka, Japan

[21] Appl. No.: 08/936,813

[22] Filed: Sep. 24, 1997

Related U.S. Application Data

[63] Continuation of application No. 08/597,308, Feb. 6, 1996, Pat. No. 5,695,667.

[30] Foreign Application Priority Data

Feb. 7, 1995 [JP] Japan ........................... 7-19335

[51] Int. Cl.[7] .............................. B23K 1/012; B23K 3/06; F27B 9/06; F27B 9/38
[52] U.S. Cl. ..................... 219/388; 219/85.19; 228/180.1
[58] Field of Search .................. 219/388, 85.19, 219/85.22; 228/41, 43, 254, 180.1, 180.21, 180.22, 207, 223; 29/741, 743

[56] References Cited

U.S. PATENT DOCUMENTS

| | | | |
|---|---|---|---|
| 4,332,341 | 6/1982 | Minetti | 228/180.22 |
| 4,688,939 | 8/1987 | Ray | 356/237 |
| 4,871,110 | 10/1989 | Fukusawa et al. | 228/41 |
| 5,058,178 | 10/1991 | Ray | 382/8 |
| 5,088,639 | 2/1992 | Gondotra et al. | 228/180.1 |
| 5,118,027 | 6/1992 | Braun et al. | 228/180.22 |
| 5,219,117 | 6/1993 | Lin | 228/41 |
| 5,284,287 | 2/1994 | Wilson et al. | 228/180.22 |
| 5,435,481 | 7/1995 | Alves et al. | 228/207 |
| 5,445,313 | 8/1995 | Boyd et al. | 228/180.22 |
| 5,467,913 | 11/1995 | Namekawa et al. | 228/41 |
| 5,506,385 | 4/1996 | Murakami et al. | 219/85.12 |
| 5,574,801 | 11/1996 | Collet-Beillon | 382/150 |
| 5,601,229 | 2/1997 | Nakazato et al. | 228/246 |
| 5,626,277 | 5/1997 | Kawada | 228/41 |
| 5,676,305 | 10/1997 | Potter et al. | 228/207 |
| 5,695,667 | 12/1997 | Eguchi et al. | 219/388 |
| 5,816,481 | 10/1998 | Economy et al. | 228/207 |

*Primary Examiner*—Joseph Pelham
*Attorney, Agent, or Firm*—Lowe Hauptman Gopstein Gilman & Berner

[57] ABSTRACT

A pickup head 11 has a lower surface with absorbing holes 9 for picking up a plurality of soldering balls 1 from a soldering ball reservoir 15 by suction force of vacuum. Pickup head 11 mounts these soldering balls 1 on electrodes 5 formed on substrate 4 placed on a conveyor 8. Then, soldering balls 1 are transported below a camera 21. Camera 21 monitors the upper surface of substrate 4 to check whether each of electrodes 5 mounts a soldering ball 1. An absorbing head 31 mounts a supplemental soldering ball 1 on a faulty electrode 5 which lacks a soldering ball 1 to be mounted thereon when this faulty electrode 5 is detected by camera 21. After all of electrodes 5 mount soldering balls 1, substrate 4 is sent by conveyor 8 to a furnace 40 where each soldering ball 1 is heated and melted to form soldering bumps 1' on electrodes 5.

7 Claims, 11 Drawing Sheets

FIG. 4
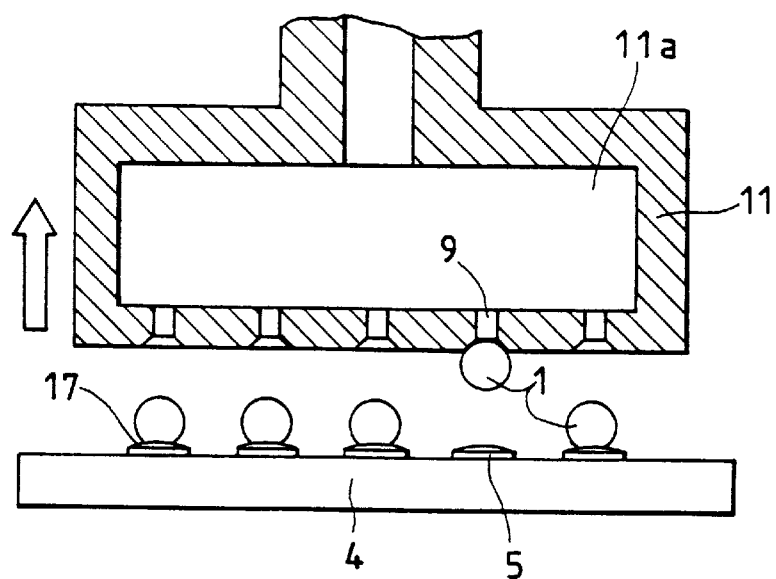
FIG. 5
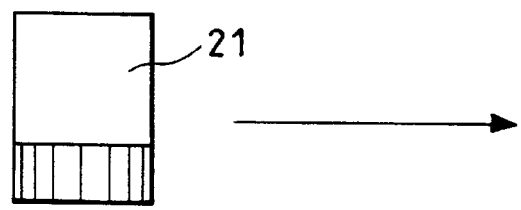
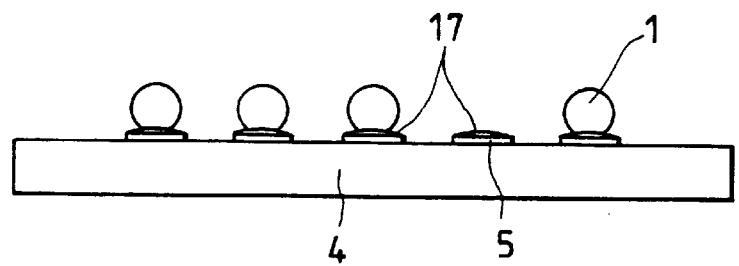

METHOD AND APPARATUS FOR MOUNTING SOLDERING BALLS ONTO ELECTRODES OF A SUBSTRATE OR A COMPARABLE ELECTRONIC COMPONENT

This application is a continuation of application Ser. No. 08/597,308 filed Feb. 6, 1996, now U.S. Pat. No. 5,695,667.

BACKGROUND OF THE INVENTION

1. Field of the Invention

This invention generally relates to a method and an apparatus for mounting soldering balls onto corresponding electrodes on an upper surface of a workpiece, such as a substrate or a comparable electronic component, to form soldering bumps thereon.

2. Prior Art

In the field of fine electronic component mounting technologies, a recently developed technology is the utilization of soldering balls for forming terminals or connecting the same on a substrate or a comparable electronic component. One typical method for shifting and mounting such soldering balls onto electrodes of a substrate will include steps of providing a plurality of absorbing holes on an absorber head as much as the electrodes of a workpiece to be processed, absorbing soldering balls from a ball reservoir at the absorbing holes of the absorber head, and transporting and mounting the absorbed soldering balls onto the workpiece by shifting the absorber head.

FIG. 14 is a side view showing a typical conventional mounting apparatus for mounting soldering balls onto electrodes of a workpiece. Reference numeral 1 represents numerous soldering balls 1 stored in a ball reservoir 2 as material for forming bumps. Reference numeral 3 represents a pickup head which is moved in an up-and-down direction by a dedicated elevation unit (not shown).

The pickup head 3 has an inside hollow space covered by a lower surface having a plurality of absorbing holes. Each absorbing hole has a circular opening whose diameter is smaller than the diameter of soldering ball 1. To absorb soldering balls 1 at these absorbing holes, vacuum is introduced into the inside hollow space of pickup head 3.

After soldering balls 1 are absorbed at the lower surface, the pickup head 3 is lifted upward by the elevation unit and then shifted in a horizontal direction by a shift table (not shown) until the pickup head 3 is positioned just above a workpiece, such as a substrate 4, which is fixedly held by a damper 6.

Subsequently, the pickup head 3 is lowered until soldering balls 1 arrive at corresponding electrodes 5 of substrate 4 and then supply of vacuum is stopped to release soldering balls 1 onto corresponding electrodes 5, thereby accomplishing a simultaneous, batch mounting operation.

The layout of numerous holes on the lower surface of pickup head 3 is determined based on the correspondence to the pattern of electrodes 5, it is thus fundamentally necessary to surely pick up soldering balls 1 at all of these absorbing holes and also to surely release all of conveyed soldering balls 1 on the corresponding electrodes 5 without failure.

However, according to the above-described conventional method, there is the problem that some of soldering balls 1 may be accidentally left in the holes of the pickup head 3.

More specifically, some of soldering balls 1 may be undesirably trapped so deeply in the absorbing holes that these soldering balls 1 are no longer disengaged from the absorbing head 3 because each soldering ball 1 is too soft to prevent deformation when it is forcibly sucked into the absorbing hole under a given vacuum pressure.

Failure of mounting or transferring all of soldering balls from pickup head 3 onto the substrate 4 will result in an undesirable production of defective substrate 4 which has one or more electrodes 5 missing soldering balls 1 to be mounted thereon.

These soldering balls 1, after being mounted on electrodes 5 of substrate 4, are heated up and melted down to form a bump on each electrode. In general, the formation of bumps on electrodes 5 is realized by a series of steps including a coating step of applying flux on electrodes or others and a bump forming step of heating, melting and hardening soldering bolls 1. However, even the most advanced mounting technology has not yet reached the level of automatically performing all of these steps as a sequential operation.

SUMMARY OF THE INVENTION

Accordingly, in view of above-described problems encountered in the prior art, a principal object of the present invention is to provide soldering ball mounting apparatus and method for surely mounting soldering balls onto designated electrodes of a workpiece without causing any failure in the mounting operation. Furthermore, the present invention has an object to provide soldering ball mounting apparatus and method for automatically performing all the mounting steps, including the flux coating step and the bump forming step, as a sequential operation.

In order to accomplish this and other related objects, a first aspect of the present invention provides a novel soldering ball mounting apparatus, according to which a mounting means mounts a plurality of soldering balls on a plurality of electrodes formed on a surface of a workpiece at a time. A mounting error inspecting means detects the presence of mounting error by the mounting means. And, a supplemental mounting means mounts a supplemental soldering ball on a faulty electrode which lacks a soldering ball to be mounted thereon when the faulty electrode is detected by the mounting error inspecting means.

According to features of the preferred embodiments, there is further provided a furnace which heats and melts the soldering balls for forming soldering bumps on the electrodes of the workpiece.

The workpiece is transported by a linearly arranged conveyor in a predetermined transportation direction, along which the mounting means, the mounting error inspecting means and the supplemental mounting means are arranged in this order from upstream to downstream.

The mounting means is moved by a shift table in a direction normal to the transportation direction, and the mounting means comprises a pickup head for picking up the soldering balls from a soldering ball reservoir and for mounting the soldering balls on the electrodes of the workpiece stopped on the conveyor.

The mounting error inspecting means comprises an XY-plane shift unit and a camera extending from the XY-plane shift unit. The camera moves along an XY plane above the workpiece stopped on the conveyor.

The supplemental mounting means comprises an XY-plane shift unit and an absorbing head extending from the XY-plane shift unit. The absorbing head picks up the supplemental soldering ball from a supplemental soldering ball reservoir and mounts the supplemental soldering ball on the faulty electrode.

Furthermore, a second aspect of the present invention provides a novel soldering ball mounting apparatus, according to which a conveyor transports a workpiece. A soldering ball reservoir, a workpiece positioning unit and a flux storage are aligned on a line normal to a transportation direction of the conveyor. A pickup head picks up a plurality of soldering balls from the soldering ball reservoir, and mounts the plural soldering balls on a plurality of electrodes formed on a surface of the workpiece at a time. A coating head dips up flux from the flux storage and applies the flux on the electrodes of the workpiece. A shift table shifts the pickup head and the coating head in a direction normal to the transportation direction of the conveyor. A mounting error inspecting means detects the presence of mounting error by the pickup head. A supplemental mounting means mounts a supplemental soldering ball on a faulty electrode which lacks a soldering ball to be mounted thereon when the faulty electrode is detected by the mounting error inspecting means. And, the mounting error inspecting means and the supplemental mounting means are disposed downstream of the soldering ball reservoir, the workpiece positioning unit and the flux storage.

According to features of the preferred embodiments, a furnace is provided downstream of the supplemental mounting means. The furnace heats and melts the soldering balls for forming soldering bumps on the electrodes of the workpiece. It is preferable to provide an optical means responsive to the presence of mounting error.

Still further, a third aspect of the present invention provides a novel soldering ball mounting method comprising the following steps: picking up a plurality of soldering balls from a soldering ball reservoir by a pickup head, the pickup head having a lower surface with plural absorbing holes; applying flux on lower faces of plural soldering balls picked up by the pickup head or on a plurality of electrodes formed on a workpiece; mounting the plural soldering balls on the plural electrodes of the workpiece by the pickup head; inspecting whether each of the plural electrodes mounts a soldering ball thereon; and mounting a supplemental soldering ball on a faulty electrode which lacks a soldering ball to be mounted thereon when the faulty electrode is detected through inspection.

According to features of the preferred embodiments, there is further provided a step of forming soldering bumps on the electrodes of the workpiece by transporting the workpiece into a furnace which heats and melts the soldering balls for forming soldering balls.

The inspecting step is performed by a mounting error inspecting means disposed along a conveyor transporting the workpiece.

The supplemental mounting step is performed by a supplemental mounting unit disposed along the conveyor. The supplemental mounting unit is provided downstream of the error inspecting means.

The flux applying step is performed by the pickup head.

The flux applying step is performed by a coating head spaced from a predetermined distance from the pickup head. In this case, the pickup head and the coating heads shift along a direction normal to a transportation direction of a conveyor which transports the workpiece. The pickup head performs the pickup step, while the coating heads performs the flux applying step simultaneously.

There is further provided a step of inspecting pickup error of the pickup head before the plural soldering balls are mounted on the electrodes of the workpiece.

Furthermore, there is provided a step of retrying the mounting step when any pickup error is detected. It is preferable to provide a step of forcibly stopping the mounting step when the number of retrials reaches a predetermined number.

BRIEF DESCRIPTION OF THE DRAWINGS

The above and other objects, features and advantages of the present invention will become more apparent from the following detailed description which is to be read in conjunction with the accompanying drawings, in which:

FIG. 4 is a view illustrating still another step of the soldering ball mounting & bump forming method in accordance with the first embodiment of the present invention;

FIG. 5 is a view illustrating yet another step of the soldering ball mounting & bump forming method in accordance with the first embodiment of the present invention;

DETAILED DESCRIPTION OF THE PREFERRED EMBODIMENTS

Figure 1:
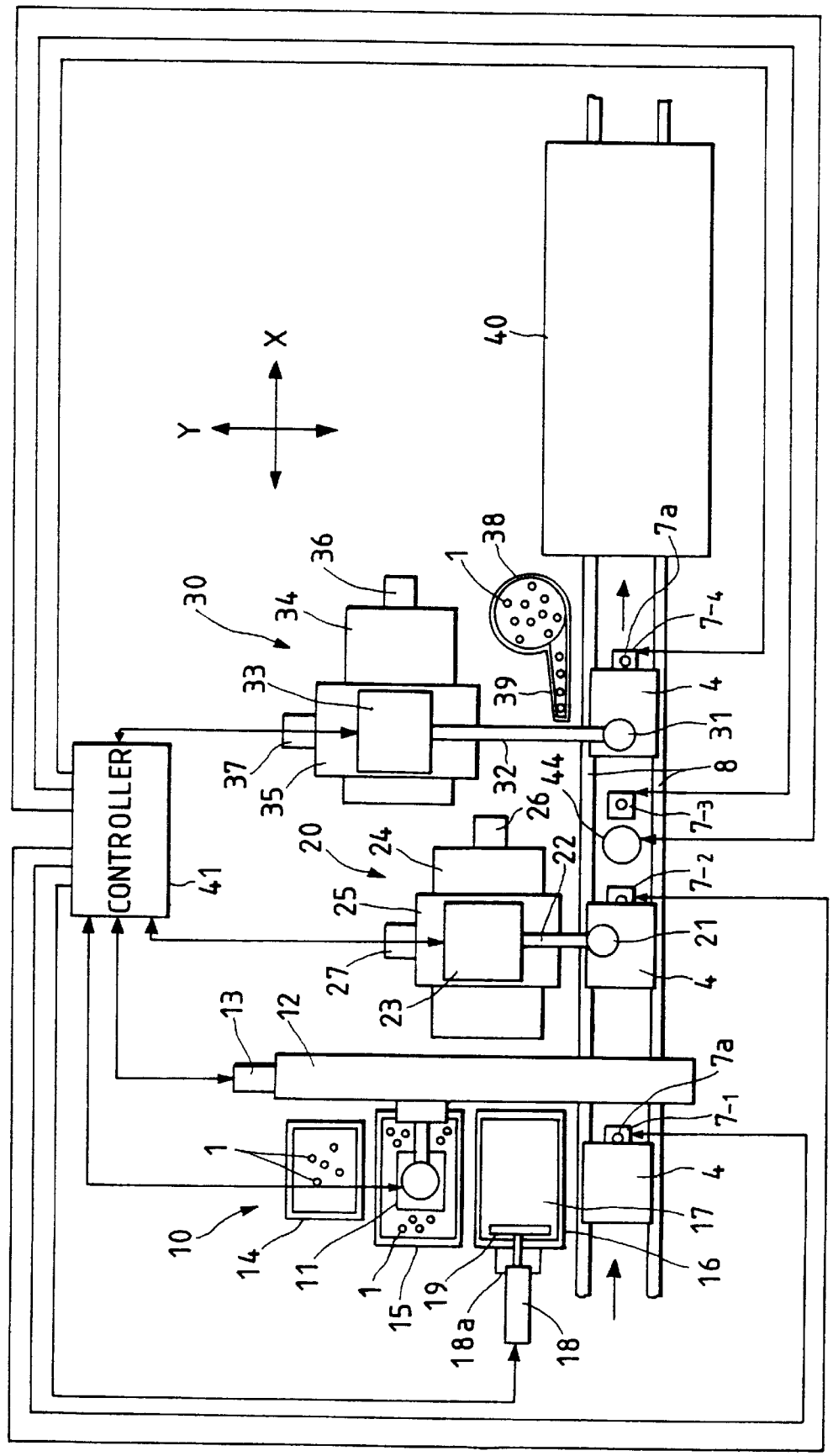
FIG. 1 is a plan view showing a schematic arrangement of a soldering ball mounting apparatus in accordance with a first embodiment of the present invention.

Preferred embodiments of the present invention will be explained in greater detail hereinafter, with reference to the accompanying drawings. Identical parts are denoted by an identical reference numeral throughout views.

FIG. 1 is a plan view showing a soldering ball mounting apparatus in accordance with the first embodiment of the present invention. In the drawing, reference numeral 4 represents a substrate serving as a workpiece which is conveyed in the X direction (i.e. right direction) on a conveyor 8. Disposed along the conveyor 8 from upstream to downstream are a first mounting station 10, a mounting error inspecting station 20, a second mounting station 30 acting as a supplemental mounting section, and a furnace 40.

Between two parallel rails of the conveyor 8, there are provided four cylinders 7 ($7_{-1}$, $7_{-2}$, $7_{-3}$ and $7_{-4}$), each interrupting the shift movement of substrate 4 in response to a signal from a controller 41. More specifically, each cylinder 7 has a rod 7a. By protruding or lifting this rod 7a upward, each cylinder 7 forcibly interrupts the shift movement of substrate 4 toward the right and stops the same at a predetermined position against movement of conveyor 8. In other words, each cylinder 7 acts as a means for positioning the substrate 4.

When the rod 7a is retracted downward, substrate 4 is released from the restriction of cylinder 7 and therefore resumes the shift movement toward the right in accordance with the movement of conveyor 8.

For various controls, controller 41 is associated with numerous components in this system. For example, controller 41 receives a signal from mounting error inspecting station 20 to detect any mounting error and actuates second mounting station 30 based on the detected signal to accomplish the mounting operation correctly.

The first mounting station 10 will be explained in greater detail, hereinafter. The first mounting station 10 is cooperative with the first cylinder $7_{-1}$ located in front thereof to act as a means for mounting soldering balls 1 on electrodes 5 (see FIG. 3) formed on an upper surface of substrate 4.

More specifically, reference numeral 11 represents a pickup head for picking up soldering balls 1. The pickup head 11 is supported by a shift table 12 and slidable along the longitudinal direction of the same. The shift table 12 extends in a direction normal to the longitudinal direction of the conveyor 8. A motor 13 is attached at the remote end of the shift table 12. By rotating the motor 13 in normal and reverse directions in response to a signal fed from controller 41, pickup head 11 causes a horizontal movement in the Y direction along the shift table 12. In this embodiment, the X direction represents the transportation direction of substrate 4 (i.e. the longitudinal direction of conveyor 8).

Sequentially disposed below the shifting path of pickup head 11 are a soldering ball container 14, a soldering ball reservoir 15, a flux storage 16 and the first cylinder $7_{-1}$ More specifically, the soldering ball container 14, soldering ball reservoir 15, flux storage 16 and first cylinder $7_{-1}$ are aligned on a line (i.e., the Y direction) perpendicular to the transportation direction (X direction) of substrate 4 (i.e. the longitudinal direction of conveyor 8).

The soldering ball container 14 is a box for collecting soldering balls 1. When pickup head 11 fails to release soldering balls 1 from its absorbing holes to substrate 4, the pickup head 11 returns above soldering ball container 14 to let soldering balls 1 fall into the container 14, thereby collecting soldering balls 1.

The soldering ball reservoir 15 is a tank for storing numerous soldering balls 1 therein. When pickup head 11 arrives at a position above soldering ball reservoir 15, an elevation unit (not shown) lowers the pickup head 11 until it reaches soldering balls 1. Then, using suction force of vacuum, the pickup head 1 absorbs soldering balls 1 at all of its absorbing holes 9 formed on the lower surface thereof.

The flux storage 16 includes a container for storing flux 17 therein. The flux storage 16 is associated with a cylinder 18 having a rod 18a shiftable in the longitudinal direction thereof in response to a signal fed from controller 41. A squeegee 19 is supported at the distal end of the rod 18a. With a reciprocative movement of the rod 18a of cylinder 18, the squeegee 19 causes a slide movement on the liquid surface of flux 17, thereby smoothing the liquid surface of flux 17.

Next, mounting error inspecting station 20 will be explained. Reference numeral 21 represents a camera which is supported on a distal end of an arm 22 protruding from a block 23. The camera 21 is positioned above the conveyor 8 to monitor each substrate 4 stopped by the second cylinder $7_{-2}$ located in front thereof. The second cylinder $7_{-2}$ is positioned at the longitudinal center of conveyor 8.

Reference numeral 24 represents an X table, and reference numeral 25 represents a Y table. An assembly of X table 24 and Y table 25, assembled by mounting Y table 25 on X table 24, constitutes a first XY shifting unit. Reference numerals 26 and 27 represent motors for actuating X table 24 and Y table 25, respectively. The block 23 is securely mounted on the Y table 25 and receives a control signal from controller 41. Accordingly, by actuating these motors 26 and 27 in response to the control signal fed from controller 41, camera 4 moves horizontally along an XY plane above substrate 4 to monitor electrodes 5 formed on substrate 4 when the substrate 4 is stopped on conveyor 8.

Next, the second mounting station 30 will be explained. Reference numeral 31 represents an absorbing head which is supported at a distal end of an arm 32 extending from a block 33. This absorbing head 31 is positioned just above conveyor 8. Reference numeral 34 represents an X table, while reference numeral 35 represents a Y table. Reference numerals 36 and 37 represent motors for actuating X table 34 and Y table 35, respectively. An assembly of X table 34 and Y table 35, assembled by mounting Y table 35 on X table 34, constitutes a second XY shifting unit.

The block 33 is securely mounted on the Y table 35, and receives a control signal from controller 41. Accordingly, by actuating motors 36 and 37 in response to the control signal fed from controller 41, absorbing head 31 moves horizontally along an XY plane above substrate 4 when the substrate 4 is stopped by the fourth cylinder $7_{-4}$ on the conveyor 8.

Reference numeral 38 represents an auxiliary soldering ball reservoir for supplying soldering balls 1. The auxiliary soldering ball reservoir 38 is a cylindrical container with a slender tray 39. A vibrator (not shown), combined with the auxiliary soldering ball reservoir 38, causes vibration to supply a row of soldering balls 1 into a groove of slender tray 39.

Using suction force of vacuum, absorbing head 31 picks up soldering balls 1 one by one from the outlet of tray 39. Each soldering ball 1 is mounted on a designated electrode 5 on substrate 4.

Reference numeral 44 represents a dispenser which applies flux on the electrode 5 when this electrode 5 lacks a soldering ball 1 to be mounted thereon. Namely, substrate 4, when it includes any faulty electrode 5 lacking a soldering ball 1 thereon, is stopped by the third cylinder $7_{-3}$ and applied flux from dispenser 44. The dispenser 44 can be moved horizontally along an XY plane by an XY shifting unit (not shown).

Furnace 40 includes a built-in heater. Each substrate 4, after soldering balls 1 are mounted on all of electrodes 5, is conveyed into furnace 40 and heated up during its passage across the heater. Thus, each soldering ball 1 is melted down and a bump is formed on a corresponding electrode 5.

FIGS. 2 through 7 illustrate the soldering ball mounting & bump forming method in accordance with the first embodiment of the present invention. Next, the details of the soldering ball mounting & bump forming method will be explained with reference to FIGS. 1 through 7.

The pickup head 11 of first mounting station 10, shown in FIG. 1, is horizontally shifted and stopped at a predetermined position above soldering ball reservoir 15. Then, the pickup head 11 is lowered until it reaches soldering balls 1 in the soldering ball reservoir 15. Then, using suction force of vacuum, the pickup head 1 absorbs soldering balls 1 at all of its absorbing holes 9 formed on the lower surface thereof.

Then, pickup head 11 moves horizontally toward flux storage 16 and moves downward until soldering balls 1 land on flux 17 stored in the flux storage 16, thereby dipping in flux 17 the lower face of each soldering ball 1.

Figure 2:
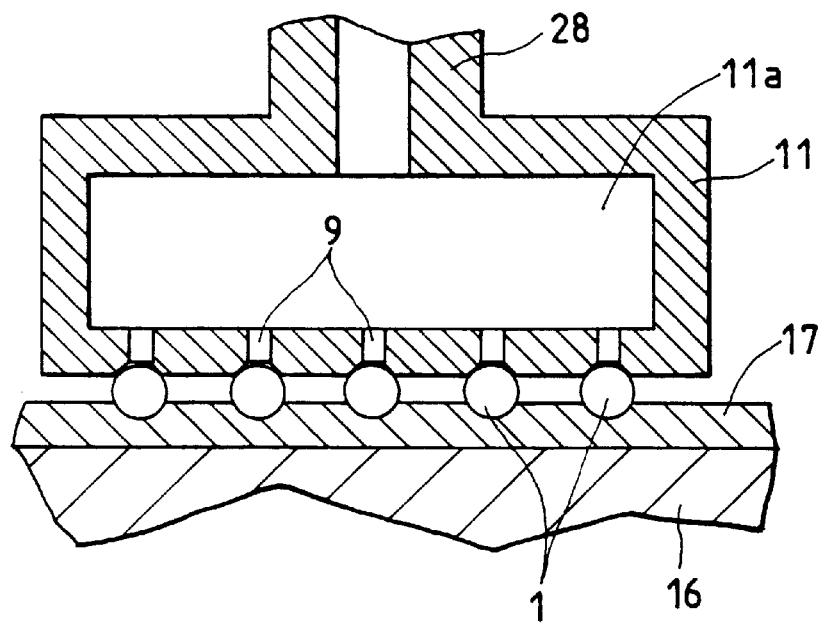
FIG. 2 is a view illustrating a step of a soldering ball mounting & bump forming method in accordance with the first embodiment of the present invention.

FIG. 2 shows the detailed condition where soldering balls 1 held by pickup head 11 are dipped in and settled on the flux 17. The pickup head 11 has its lower surface with numerous absorbing holes 9 opened in a predetermined matrix pattern. Each of absorbing holes 9 has a diameter smaller than that of each soldering ball 1. The pickup head 11 has an inside hollow space 11a communicated with a vacuum source (not shown) through a pipe 28. Hence, by the aid of suction force of vacuum, each absorbing hole 9 can capture a single soldering ball 1 at an opening periphery thereof.

The pickup head 11 is lowered until soldering balls 1 are dipped or soaked in the flux 17 at their lower faces as shown in FIG. 2. Then, the pickup head 11 is raised upward as shown in FIG. 3, thereby holding flux 17 at the lower faces of all the soldering balls 1.

The flux 17 has such a large viscosity that it requires repair of its roughened surface after soldering balls 1 are soaked. Accordingly, it is necessary to move the squeegee 19 in a reciprocative manner to flatten the rough surface of flux 17.

Figure 3:
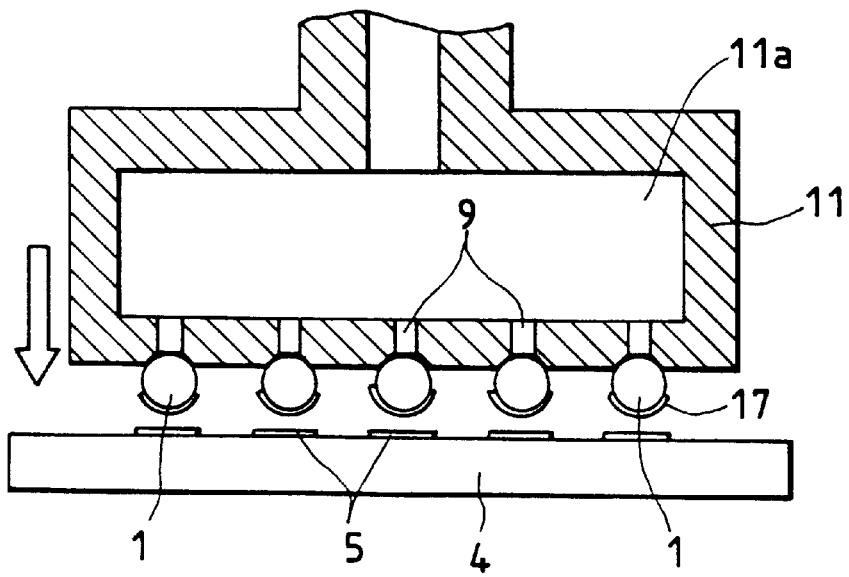
FIG. 3 is a view illustrating another step of the soldering ball mounting & bump forming method in accordance with the first embodiment of the present invention.
Figure 6:
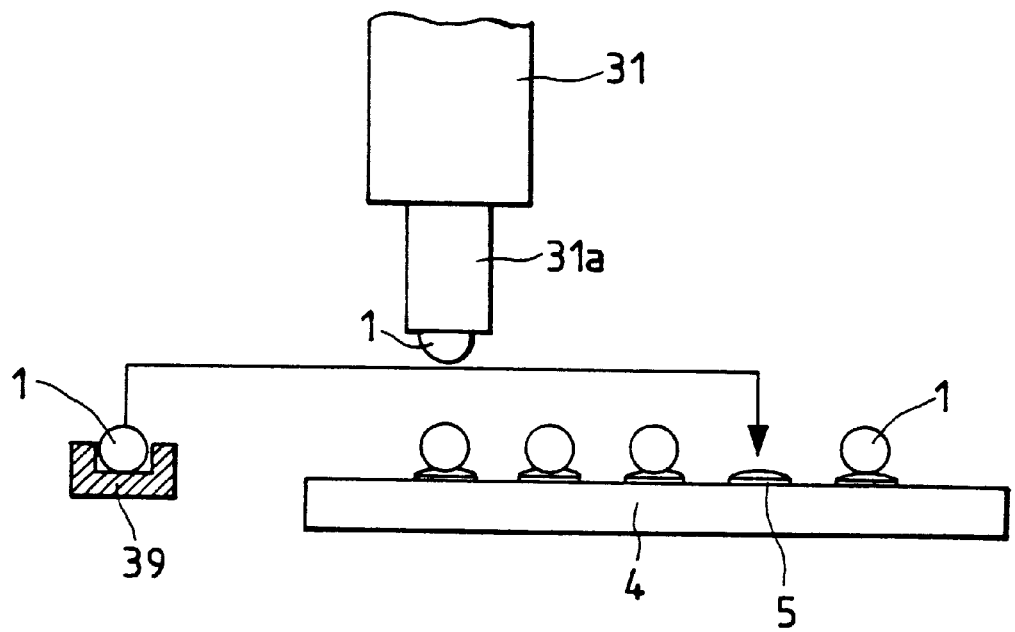
FIG. 6 is a view further illustrating another step of the soldering ball mounting & bump forming method in accordance with the first embodiment of the present invention.

Subsequently, pickup head 11 is horizontally shifted and lowered toward substrate 4 to mount soldering balls 1 on corresponding electrodes 5, as shown in FIG. 3.

As the lower face of each soldering ball 1 holds flux 17, the pickup head 11 is lowered to land each soldering ball 1 at its bottom on a corresponding electrode 5 formed on the upper surface of substrate 4. Then, supply of vacuum to the inside hollow space 11a of pickup head 11 is stopped to release each soldering ball 1 from the suction force of vacuum. Then, the pickup head 11 is raised upward, leaving soldering balls 1 on corresponding electrodes 5 of substrate 4. In this manner, a series of batch mounting operation of soldering balls 1 onto electrodes 5 of substrate 4 is accomplished.

FIG. 4 shows a detailed condition where pickup head 11 is raised upward after finishing the batch mounting operation. In this embodiment, one soldering ball 1 is still engaged or trapped in an absorbing hole 9 located second from the right end, failing to land on the corresponding electrode 5 (located second from the right end) of substrate 4.

To remedy such a failure, the present invention causes dispenser 44 to apply flux on the electrode 5 when it lacks a soldering ball 1 to be mounted thereon and then controls second mounting station 30 to mount a supplemental soldering ball 1 on such a faulty electrode 5.

More specifically, substrate 4 mounting soldering balls 1 thereon is transported by conveyor 8 in the right direction until it is stopped by the rod 7a of second cylinder $7_{-2}$. Then, camera 21 is horizontally shifted along an XY plane above substrate 4 to monitor each of numerous electrodes 5 arranged in a matrix pattern, thereby judging whether each electrode 5 mounts a soldering ball 1 thereon. In other words, camera 21 has a function of checking the presence of any faulty electrode 5.

FIG. 5 shows a detailed condition where camera 21 monitors electrodes 5 along the surface of substrate 4. According to this embodiment, one electrode 5, which is second from the right end, lacks a soldering ball 1. Hence, the presence of such a faulty electrode 5 is notified to controller 41.

Then, substrate 4 is released from second cylinder $7_{-2}$ upon retracting rod 7a, and is subsequently transported right by conveyor 8 until it is again stopped by third cylinder $7_{-3}$ located below dispenser 44. The dispenser 44 applies flux on electrode 5 when it lacks a soldering ball 1 thereon. Thereafter, substrate 4 is again transported right until it is stopped by the fourth cylinder $7_{-4}$.

When the substrate 4 is positioned at the fourth cylinder $7_{-4}$, controller 41 sends a command to absorbing head 31. Receiving this command signal, the absorbing head 31 of second mounting station 30 picks up a soldering ball 1 from tray 39 at the lower end of its nozzle 31a by using suction force of vacuum. Then, the absorbing head 31 moves toward the faulty electrode 5 and mounts a soldering ball 1 thereon.

Figure 7:
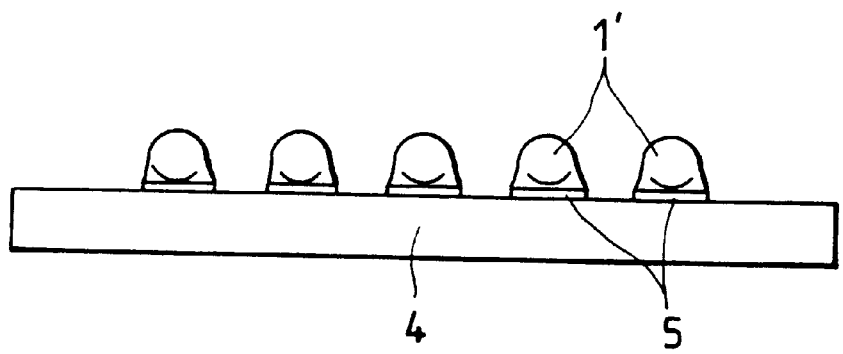
FIG. 7 is a view moreover illustrating another step of the soldering ball mounting & bump forming method in accordance with the first embodiment of the present invention.

After soldering ball 1 is mounted on faulty electrode 5, substrate 4 is transported by conveyor 8 into furnace 40 where each soldering ball 1 is heated up and melted down. Then, the substrate 4 is cooled down to harden the melted solder on each electrode 5, thereby forming a soldering bump 1' on each electrode 5 as shown in FIG. 7.

Returning to FIG. 4, when pickup head 11 fails to mount a soldering ball 1 on substrate 4, controller 41 sends a command to pickup head 11 to move toward soldering ball container 14. When pickup head 11 reaches soldering ball container 14, pressurized air is supplied into inside hollow space 11a. With this pressurized air, any soldering ball 1 trapped in the absorbing hole 9 is disengaged and collected in the container 14.

Next, a second embodiment of the present invention will be explained with reference to FIGS. 8 to 13.

Figure 8:
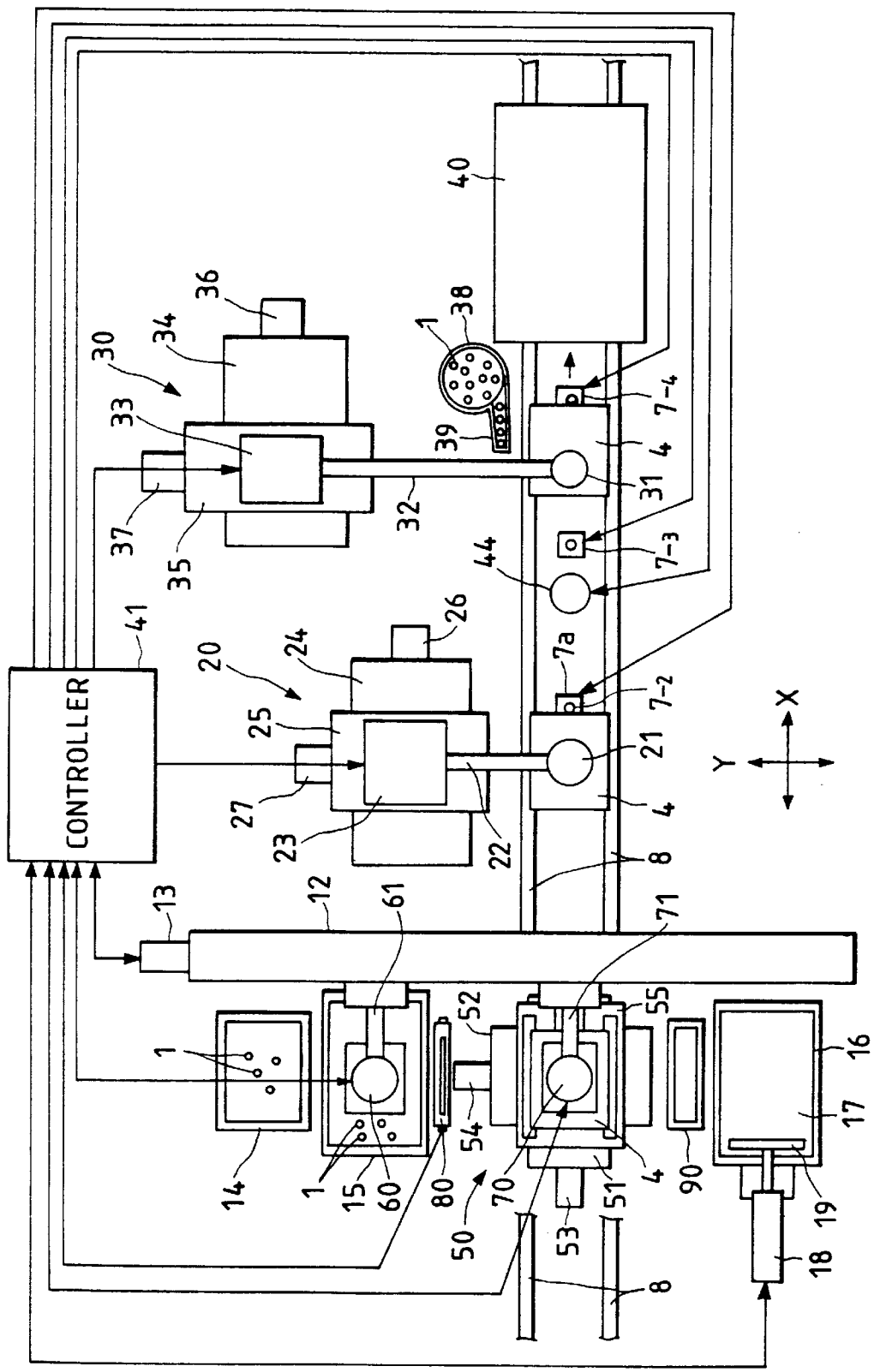
FIG. 8 is a plan view showing a schematic arrangement of a soldering ball mounting apparatus in accordance with a second embodiment of the present invention.

FIG. 8 shows an overall arrangement of a soldering ball mounting & bump forming apparatus in accordance with the second embodiment.

The second embodiment is identical with the first embodiment in the construction of mounting error inspecting station 20, second mounting station 30 and furnace 40. In other words, the second embodiment is different from the first embodiment in the arrangement of first mounting station 10. Therefore, the arrangement of first mounting station 10 will be explained in greater detail.

According to the second embodiment, soldering ball container 14 and soldering ball reservoir 15 are disposed at one side of conveyor 8, while flux storage 16 is disposed on the other side of conveyor 8.

Furthermore, a third XY shifting unit 50 is provided along conveyor 8. This third XY shifting unit 50 comprises an X table 51, a Y table 52 and motors 53 and 54 for actuating X and Y tables 51, 52 respectively. The third shifting unit 50 has a function of positioning substrate 4 at a predetermined position. A table 55 is securely mounted on Y table 52. Substrate 4 is mounted on table 55. Accordingly, when motors 53 and 54 drive X table 51 and Y table 52 in both X and Y directions, substrate 4 shifts in the same direction as each of X and Y tables 51 and 52. Thus, substrate 4 is positioned at a predetermined position.

Shift table 12 extends across conveyor 8 between soldering ball container 14 and flux storage 16. Shift table 12 supports a pickup head 60 and a coating head 70. The pickup head 60 serves as a first mounting means. These two heads 60 and 70 are simultaneously shifted in the Y direction. Reference numeral 61 represents an arm which connects pickup head 60 and shift table 12. Reference numeral 71 represents an arm which connects coating head 70 and shift table 12.

The distance between pickup head 60 and coating head 70 is equal to the distance between soldering ball reservoir 15 and XY shifting unit 50, and also equal to the distance between XY shifting unit 50 and flux storage 16.

With such settings, it becomes possible to simultaneously perform the mounting operation of soldering balls 1 and the coating operation of flux 17 using the common shift table 12. Namely, pickup head 60 mounts soldering balls 1 on substrate 4 while coating head 70 applies flux 17 on substrate 4.

An optical unit 80 is provided between soldering ball reservoir 15 and third XY shifting unit 50. A cleaning unit 90 is provided between third XY shifting unit 50 and flux storage 16. Soldering ball container 14, soldering ball reservoir 15, optical unit 80, XY shifting unit 50, cleaning unit 90 and flux storage 16 are aligned on a line (i.e. Y direction) normal to the transportation direction (i.e. X direction) of conveyor 8.

Figure 9:
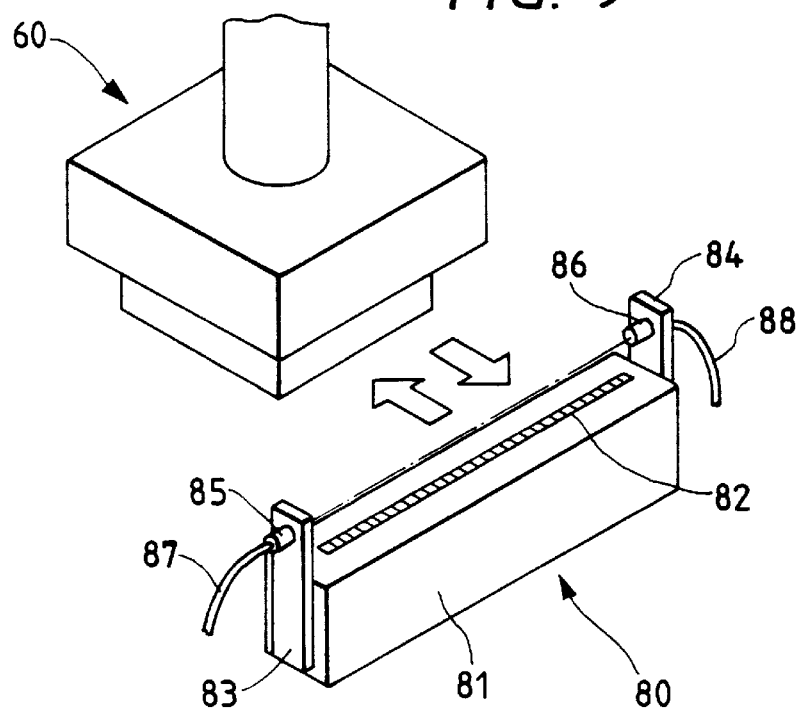
FIG. 9 is a perspective view showing a pickup head and an optical unit equipped in the soldering ball mounting apparatus in accordance with the second embodiment of the present invention.
Figure 10:
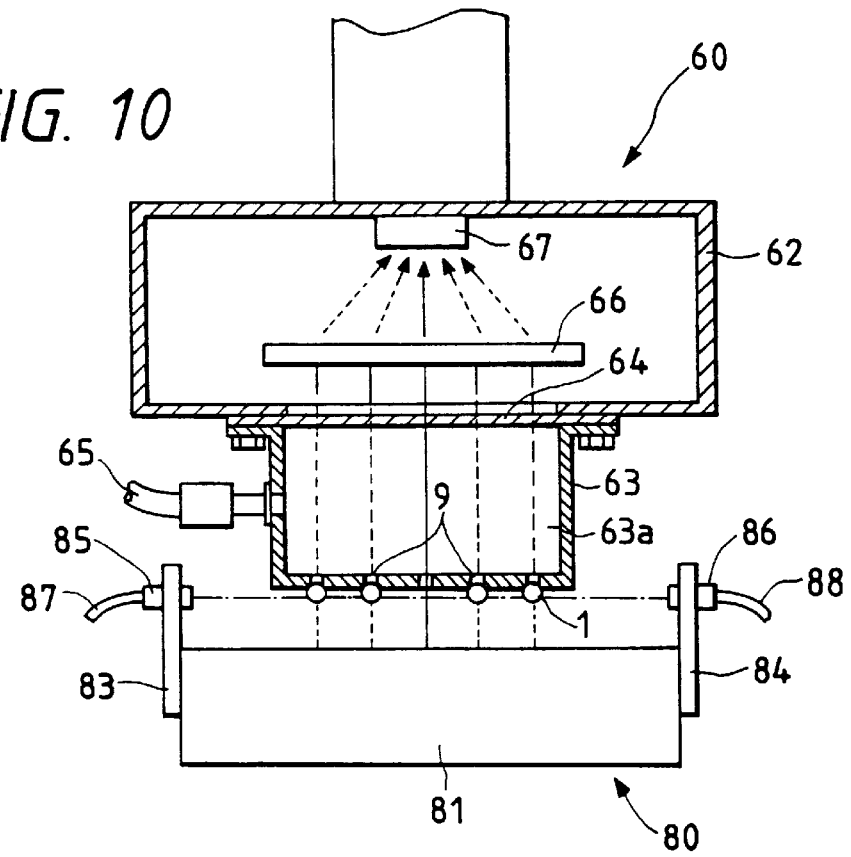
FIG. 10 is a cross-sectional view showing the pickup head and the optical unit equipped in the soldering ball mounting apparatus in accordance with the second embodiment of the present invention.

Next, with reference to FIGS. 9 and 10, pickup head 60 and optical unit 80 will be explained. Pickup head 60 comprises an upper casing 62 and a lower casing 63. A transparent plate 64 is disposed between upper casing 62 and lower casing 63.

Lower casing 63 has an inside hollow space 63a communicating with a vacuum source (not shown) through a tube 65. Lower casing 63 has a lower surface with numerous absorbing holes 9. When inside hollow space 63a is filled with vacuum, lower casing 63 absorbs soldering balls 1 at their absorbing holes 9.

Upper casing 62 includes a convergence element 66 and a light detecting sensor 67 housed therein.

Optical unit 80 includes a base body 81 having a longitudinally extended box shape. On the upper surface of base body 81, there is disposed a linearly arranged light source 82 which emits light upward. A pair of parallel standing plates 83 and 84 is provided at longitudinal (right and left) ends of base body 81. A light emitting device 85 is provided on the left standing plate 83, while a light receiving device 86 is provided on the right standing plate 84. Reference numerals 87 and 88 represent codes. A light beam, horizontally emitted from light emitting device 85 in parallel to the upper surface of base body 81, enters into light receiving device 86. Function of optical unit 80 will be explained later.

Figure 11:
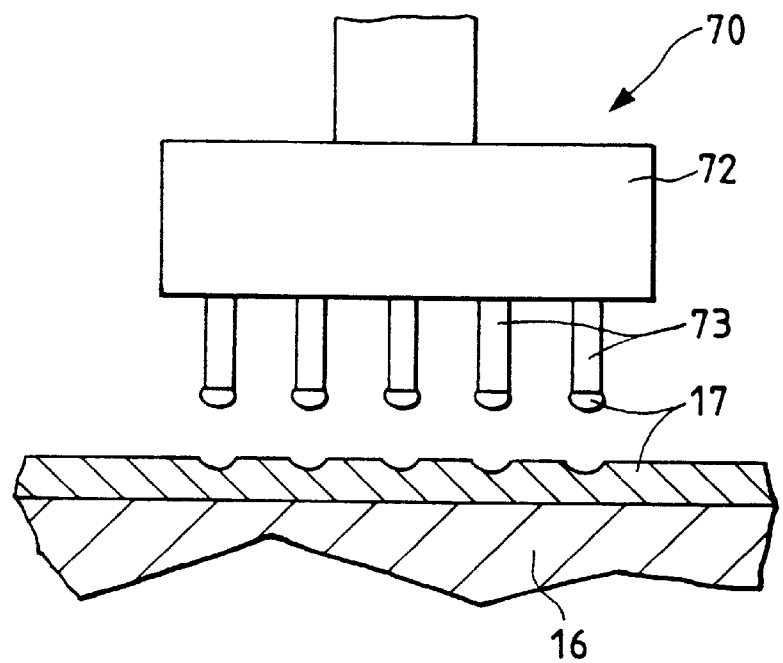
FIG. 11 is a view illustrating a flux coating operation performed by the soldering ball mounting apparatus in accordance with the second embodiment of the present invention.

Next, with reference to FIGS. 11 and 12, coating head 70 will be explained. In FIG. 11, coating head 70 comprises a rectangular main body 72 having a plurality of pins 73 at its lower surface. Coating head 70, after it arrives at a position above flux storage 16, moves downward in the up-and-down direction until pins 73 reach and dip in flux 17. Thus, each pin 73 holds flux 17 at the lower face thereof. Next, coating head 70 shifts toward third XY shifting unit 50.

Figure 12:
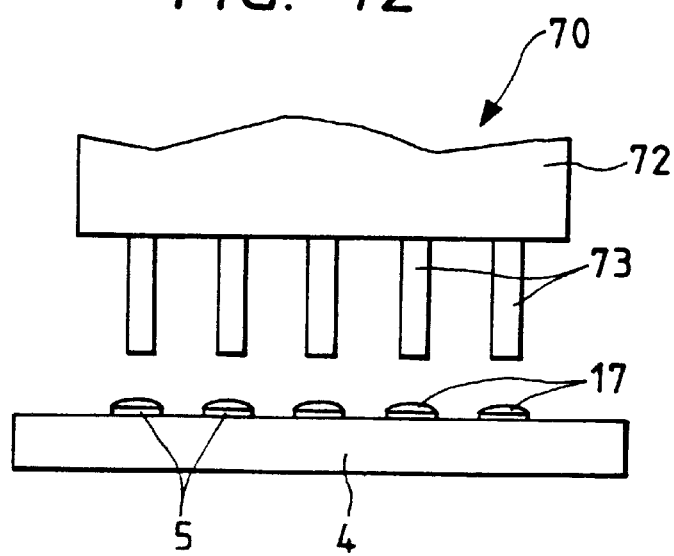
FIG. 12 is a view illustrating the flux coating operation performed by the soldering ball mounting apparatus in accordance with the second embodiment of the present invention.

When coating head 70 arrives at a position above substrate 4 placed on XY shifting unit 50 as shown in FIG. 12, coating head 70 moves downward and transfers flux 17 attached on the lower surface of each pin 73 onto a corresponding electrode 5, thereby accomplishing a simultaneous, batch application of flux 17 to electrodes 5.

Figure 13:
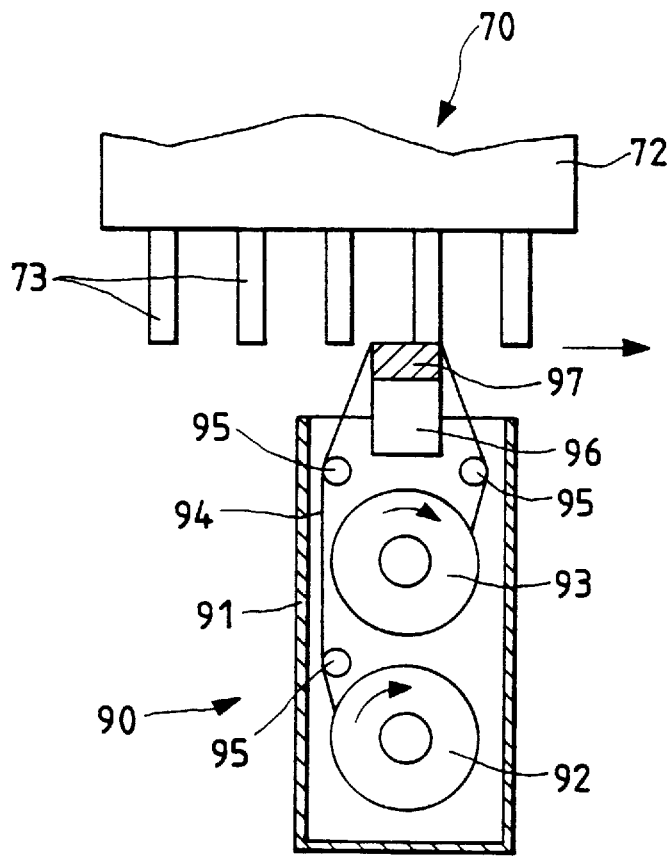
FIG. 13 is a cross-sectional view showing a cleaning unit incorporated in a coating head of the soldering ball mounting apparatus in accordance with the second embodiment of the present invention.
Figure 14:
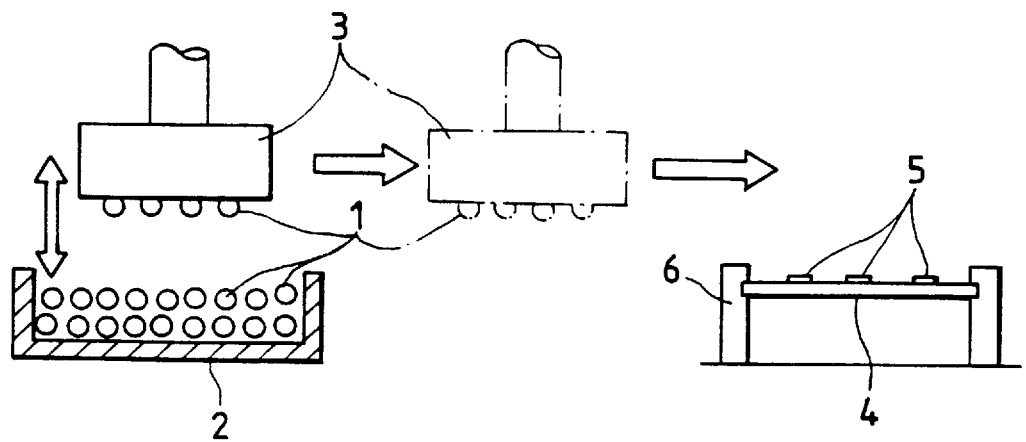
FIG. 14 is a side view showing a conventional soldering ball mounting apparatus.

Cleaning unit 90 will be explained with reference to FIG. 13. Reference numeral 91 represents a casing in which a supply reel 92 and a receiving reel 93 are housed. Supply reel 92 and receiving reel 93, driven by a motor (not shown), cause rotational motions about their axes.

A cleaning tape 94 is wound around supply reel 92. A block 96 is provided at the top of casing 91. A grounding member 97, made of resilient member, is mounted on the upper surface of block 96. Reference numeral 95 represents a guide roller which guides cleaning tape 94 when supply reel 92 and receiving reel 93 simultaneously rotate in the direction shown by an arrow.

In other words, cleaning tape 94 travels along guide rollers 95 and grounding member 97 before being taken up by receiving reel 94. Cleaning tape 93 would be, for example, a synthetic resin tape having a rough surface.

As shown in the drawing, by shifting the coating head 70 in the horizontal direction, each pin 73 extending from main body 72 lands on grounding member 97 and slides along the surface of grounding member 97. Thus, all of pins 73 are brought into contact with cleaning tape 94 at their lower faces, thereby removing or cleaning flux 17 off their lower faces.

By winding up cleaning tape 94, the contaminated part of cleaning tape 94 is taken up by receiving reel 93 and a non-used part of cleaning tape 94 comes on grounding member 97.

Overall operation of soldering ball mounting & bump forming apparatus in accordance with the second embodiment will be explained, hereinafter.

As explained with reference to FIG. 8, the positional relationship between pickup head 60 and coating head 70 is restricted in such a manner that pickup head 60 is positioned above soldering ball reservoir 15 when coating head 70 is positioned above substrate 4. In this condition, pickup head 60 moves in the up-and-down direction to pick up soldering balls 1 at absorbing holes 9 opened on the lower surface thereof by the aid of suction force of vacuum. Meanwhile, coating head 70 moves in the up-and-down direction to supply or transfer flux 17 attached on the lower faces of pins 73 onto electrodes 5 of substrate 4, as explained with reference to FIGS. 11 and 12.

Next, shift table 12 is actuated to shift pickup head 60 toward substrate 4 and, at the same time, to shift coating head 70 toward flux storage 16.

On the way from soldering ball reservoir 15 to substrate 4, pickup head 60 passes over optical unit 80 as explained with reference to FIGS. 9 and 10. In this instance, pickup head 60 receives at its bottom a linear light beam emitted from light source 82.

If all of absorbing holes 9 surely capture soldering balls 1, i.e. when there is no pickup error, no light is detected by light sensor 67 because all of absorbing holes 9 are closed by soldering balls 1.

On the contrary, if any one of absorbing holes 9 is vacant due to failure in capturing a soldering ball 1, the light beam will reach light sensor 67 through this vacant absorbing hole 9. For example, according to the example shown in FIG. 10, the central absorbing hole 9 fails to capture a soldering ball 1. Hence, a light beam (solid line in the drawing) enters into lower casing 63 and passes through transparent plate 64 and convergence element 66 successively and finally arrives at light sensor 67. Hence, it becomes possible to detect the presence of pickup error by measuring any light beam entering into pickup head 60. In other words, optical unit 80 serves as a detecting means for detecting the presence of pickup error.

When any pickup error is detected, shift table 12 is shifted in the opposite direction to return pickup head 60 to soldering ball reservoir 15. Pickup head 60 moves again in the up-and-down direction to perform the above-described pickup operation of soldering balls 1.

Subsequently, pickup head 60 again passes over optical unit 80. At this moment, the presence of pickup error is again inspected.

If any pickup error is detected, pickup head 60 is again returned toward soldering ball reservoir 15 to restart the pickup operation of soldering balls 1.

The pickup error may not be completely eliminated even after consecutive and plural executions of pickup operations. In such a case, it can be concluded that a serious trouble occurs somewhere in the system. Based on this judgment, pickup head 60 is positioned above soldering ball container 14. Supply of vacuum is stopped, and pressurized air is introduced into lower casing 63 to forcibly disengage soldering ball 1 from absorbing hole 9. Thus, the soldering ball 1 trapped in absorbing hole 9 falls into soldering ball container 14. After that, the cause of trouble is inspected. In this case, it will be preferable to notify an operator of occurrence of trouble by using an alarm means such as a buzzer.

As shown in FIG. 8, light source 82 incorporated in optical unit 80 is disposed along the longitudinal direction (X direction) of optical unit 80 which is normal to the shifting direction (Y direction) of pickup head 60. Accordingly, when pickup head 60 passes over optical unit 80, all of absorbing holes 9 arranged in a matrix pattern on the lower surface of pickup head 60 can be quickly inspected to detect the presence of faulty electrode 5 (i.e. pickup error).

When no pickup error is detected, shift table 12 is actuated to shift and position pickup head 60 above substrate 4. Then, as explained with reference to FIGS. 3 and 4, pickup head 60 moves downward to mount soldering balls 1 on corresponding electrodes 5 of substrate 4, which are already applied flux 17 by coating head 70.

Meanwhile, coating head 70 is positioned above flux storage 16 when pickup head 60 is positioned above substrate 4, according to their positional relationship. Coating head 70 moves downward to let each pin 73 dip in flux 17 and hold the same at the lower face thereof.

Next, shift table 12 is actuated in the opposite direction to shift pickup head 60 toward soldering ball reservoir 15 and, at the same time, to shift coating head 70 toward substrate 4. On the way from substrate 4 to soldering ball reservoir 15, optical unit 80 detects the presence of any mounting error.

More specifically, when pickup head 60 passes over optical unit 80, light emitting device 85 transmits a light beam toward light receiving device 86 along a line passing through soldering balls 1 if these soldering balls 1 are engaged in absorbing holes 9.

If the mounting operation of soldering balls 1 onto electrodes 5 of substrate 4 is successfully accomplished, no soldering balls 1 will be left in absorbing holes 9 on the lower surface of lower casing 63. Accordingly, as long as there is no failure in the mounting operation of soldering balls 1, the light beam transmitted from light emitting device 85 can be received by light receiving device 86.

Receiving no light at light receiving device 86 will lead to the conclusion that a mounting error of soldering ball 1 occurs somewhere on substrate 4. In this manner, any mounting error of soldering balls 1 can be optically detected by using these light emitting and receiving devices 85 and 86.

If pickup head 60 fails to mount soldering balls 1 onto all of electrodes 5 of substrate 4, one or more soldering balls 1 will be left in absorbing hole(s) opened on the lower surface of lower casing 63. In such a case, a light beam emitted from light emitting device 85 will be reflected by soldering ball(s) 1 engaged in absorbing hole(s) 9, without reaching light receiving device 86. Based on this fact, the presence of any-mounting error is detected.

Pickup head 60 is then moved and positioned above soldering ball container 14 to forcibly disengage soldering ball(s) 1 from the absorbing holes 9, thereby dropping soldering ball(s) 1 and collecting the same in container 14. That is, light emitting device 85 and light receiving device 86 cooperatively serve as a mounting error detecting means.

Subsequently, substrate 4 is transported downstream by conveyor 8, and the presence of mounting error is additionally checked by mounting error inspecting station 20 in the same manner as the first embodiment, for the purpose of double checking of mounting error. However, as optical unit 80 has sufficient function of detecting mounting error, it is of course possible to remove the mounting error inspecting station 20.

Then, a supplemental soldering ball 1 is mounted on a faulty electrode 5 by the second mounting station 30 in the same manner as in the first embodiment. After that, substrate 4 is transported into furnace 40 to melt soldering balls 1, thereby forming a soldering bump on each electrode 5.

The cleaning of each pin 73 is automatically performed by cleaning unit 90 when coating head 70 moves along a shifting path from substrate 4 to flux storage 16.

As apparent from the foregoing description, the second embodiment is characterized in that two heads, pickup head 60 and coating head 70, are simultaneously shifted in the Y direction by shift table 12 acting as a common shifting means for accomplishing both the mounting operation of soldering balls 1 and the coating operation of flux 17 at a time.

Accordingly, the second embodiment can improve the overall efficiency in the soldering ball mounting & bump forming operation. Furthermore, provision of optical unit 80 makes it possible to accurately detect each of pickup error and mounting error, enabling an early recovery from such failures. Moreover, provision of cleaning unit 90 makes it possible to adequately clean each pin 73 of coating head 70 and assure a proper amount of flux supply to each pin 73.

Figure 15:
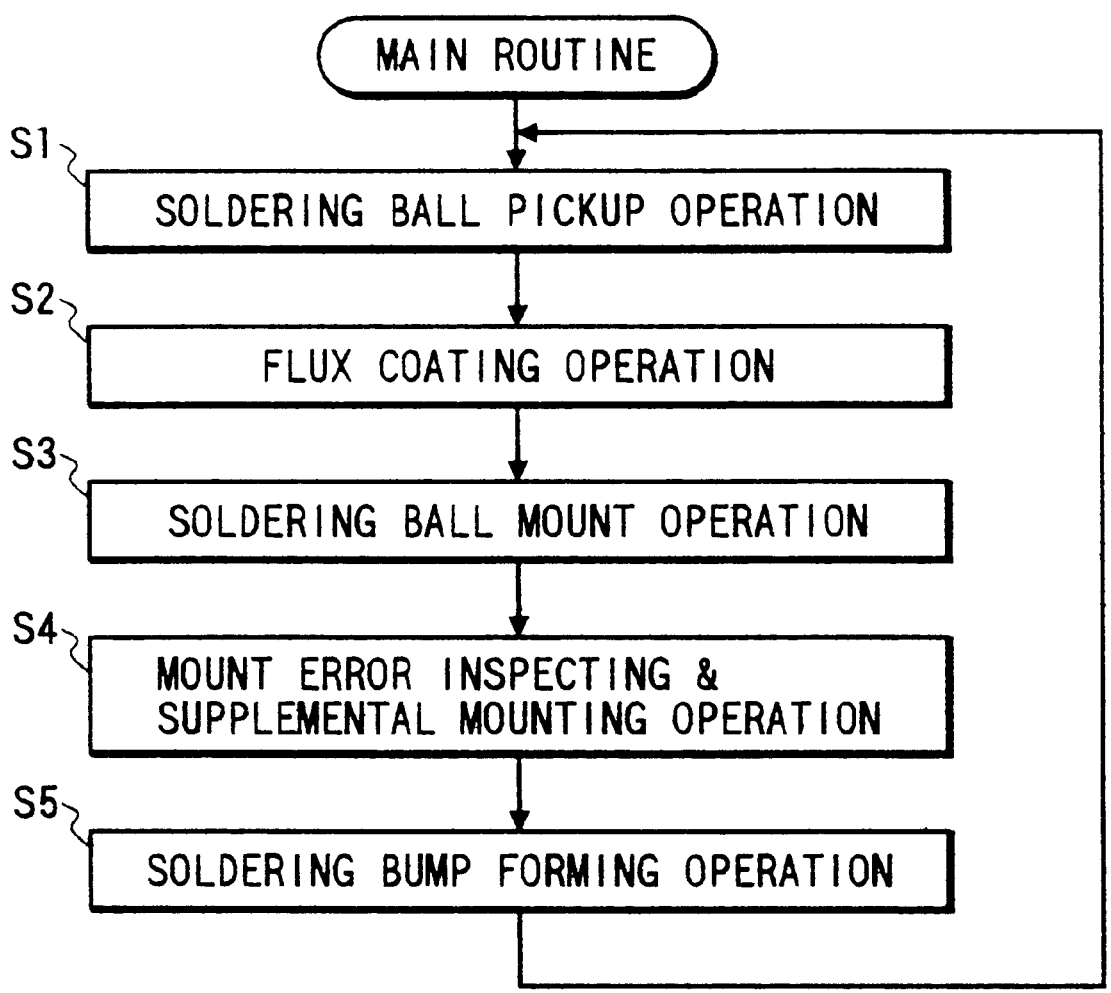
FIG. 15 is a flow chart showing a main routine performed by a controller of the soldering ball mounting & bump forming apparatus in accordance with the first embodiment of the present invention.
Figure 16:
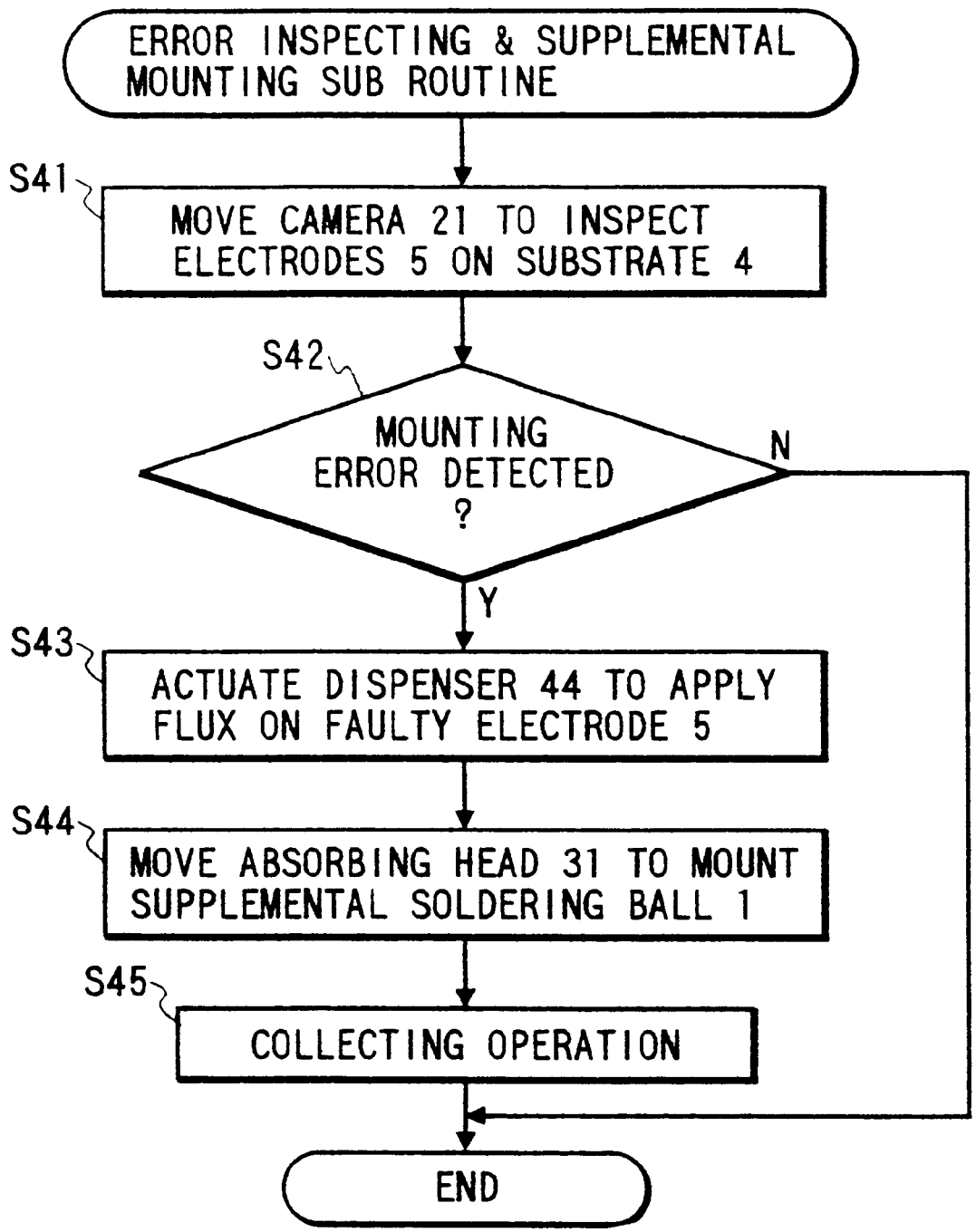
FIG. 16 is a flow chart showing details of an error inspecting & supplemental mounting sub routine performed by the controller of the soldering ball mounting & bump forming apparatus in a accordance with the first embodiment of the present invention.
Figure 17:
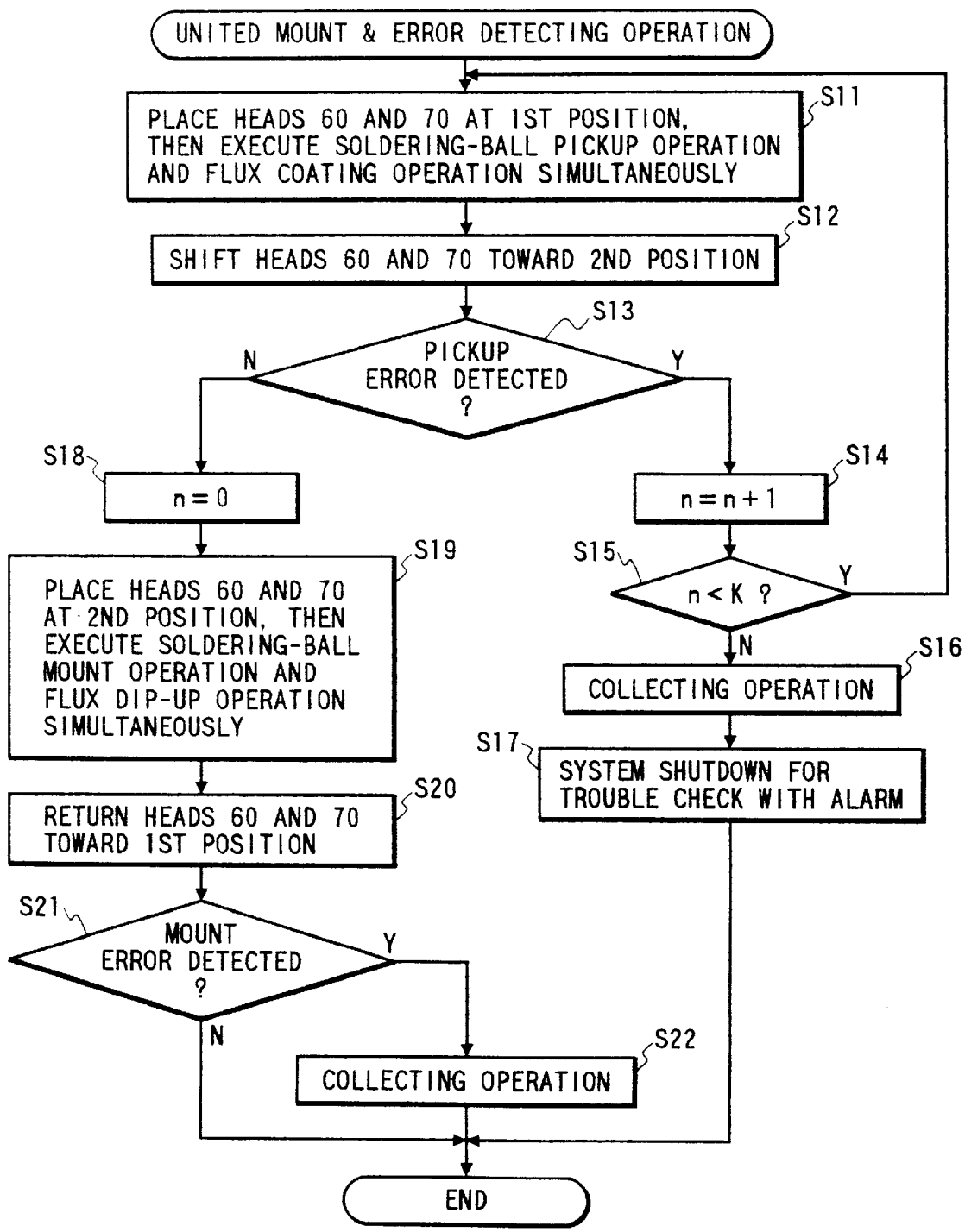
FIG. 17 is a flow chart showing details of a united mount & error detecting operation routine performed by the controller of the soldering ball mounting & bump forming apparatus in accordance with the second embodiment of the present invention.

Above described operations are controlled by controller 41 based on a program memorized therein. FIGS. 15 through 17 show flow charts for performing the above-described soldering ball mounting & bump forming operations in accordance with the present invention.

FIG. 15 shows a main routine performed by controller 41 of FIG. 1 in accordance with the first embodiment of the present invention.

First, in step S1, the soldering ball pickup operation is performed. Namely, controller 41 causes pickup head 11 to horizontally shift along shift table 12 and stop at a predetermined position just above soldering ball reservoir 15, and then causes pickup head 11 to move downward until it reaches soldering balls 1 in the soldering ball reservoir 15 and absorb soldering balls 1 at all of its absorbing holes 9, and then causes pickup head 11 to rise upward.

Next, in step S2, the flux coating operation is performed. More specifically, controller 41 causes pickup head 11 to horizontally shift along shift table 12 and stop at a predetermined position just above flux storage 16, and then causes pickup head 11 to move downward until soldering balls 1 dip in flux 17 stored in the flux storage 16, and then causes pickup head 11 to rise upward.

Next, in step S3, the soldering ball mount operation is performed. Controller 41 causes pickup head 11 to further horizontally shift and stop at a predetermined position just above conveyor 8, and then causes pickup head 11 to move downward to transfer soldering balls 1 onto corresponding electrodes 5 of substrate 4 stopped by first cylinder $7_{-1}$ on conveyor 8, and then causes pickup head 11 to rise upward.

Next, in step S4, the mount error inspection & supplemental mounting operation is performed.

FIG. 16 shows details of the error inspecting & supplemental mounting sub routine performed by the controller 41 in accordance with the first embodiment of the present invention.

When substrate 4 mounting soldering balls 1 thereon is stopped by the rod 7a of second cylinder $7_{-2}$, controller 41 starts this sub routine.

First, in step S41, controller 41 causes camera 21 of mounting error detecting station 20 to horizontally shift along an XY plane above substrate 4 to monitor each of numerous electrodes 5 arranged in a matrix pattern, thereby judging whether each electrode 5 mounts a soldering ball 1 thereon.

Next, in step S41, controller 41 makes a judgment as to whether any mounting error is detected, based on the inspection result obtained through camera 21. If faulty electrode 5 which lacks a soldering ball 1 to be mounted thereon is detected (i.e. "YES" in step S42), controller 41 executes steps S43 and S44.

More specifically, in step S43 (i.e. when the mounting error is detected), substrate 4 is transported downstream and stopped by third cylinder 73. Then, controller 41 causes dispenser 44 to apply flux on faulty electrode 5. Thereafter, substrate 4 is further transported downstream and stopped by fourth cylinder $7_{-4}$.

Next, in step S44, controller 41 causes absorbing head 31 to pick up a soldering ball 1 from tray 39, and causes absorbing head 31 to mount this soldering ball 1 on the faulty electrode 5, thereby accomplishing the supplemental mounting operation. Meanwhile, in step S45, controller 41 causes pickup head 11 to move to soldering ball container 14 to forcibly disengage the trapped soldering ball 1 from pickup head 11 and return it to soldering ball container 14.

Then, controller 41 returns to step S5 of the main routine of FIG. 15.

On the other hand, if no mounting error is detected (i.e. "NO" in step S42), controller 41 immediately terminates this sub routine and returns to step S5 of the main routine of FIG. 15.

In step S5 of the main routine, controller 41 allows substrate 4 to enter into furnace 40 where each soldering ball 1 is heated up and melted down. And then, substrate 4 is cooled down to harden the melted solder on each electrode 5, thereby forming a soldering bump 1' on each electrode 5 as shown in FIG. 7.

By repeating the above-described sequential operations, the soldering ball mounting & bump forming operation of the present invention can be accomplished.

The second embodiment of the present invention is characterized in that steps S1 to S3 of FIG. 15 are replaced by a united mount & error detecting operation which is performed in somewhat simultaneous, mixed, parallel manner.

FIG. 17 shows details of such a united mount & error detecting operation routine performed by the controller 41 of FIG. 8 in accordance with the second embodiment.

First, in step S11, controller 41 places pickup head 60 and coating head 70 at a predetermined first position where pickup head 60 is positioned above soldering ball reservoir 15 while coating head 70 is positioned above substrate 4. Then, controller 41 causes pickup head 60 to move in the up-and-down direction to pick up soldering balls 1 at its absorbing holes 9, while controller causes coating head 70 to move in the up-and-down direction to supply or transfer flux 17 attached on the lower faces of its pins 73 onto electrodes 5 of substrate 4. These operations are performed simultaneously; hence, it can bring great improvement in the efficiency of operations.

Next, in step S12, controller 41 causes both heads 60 and 70 to shift toward a predetermined second position where pickup head 60 is positioned above substrate 4 while coating head 70 is positioned above flux storage 16.

Next, controller 41 makes a judgment in step S13 as to whether any pickup error exists. More specifically, on the way from soldering ball reservoir 15 to substrate 4, pickup head 60 passes over optical unit 80 as explained with reference to FIGS. 9 and 10. In this instance, pickup head 60 receives at its bottom a linear light beam emitted from light source 82. If there is any pickup error, this light beam is received by light sensor 67. Thus, controller 41 can detect the presence of pickup error.

If any pickup error is detected (i.e. "YES" in step S13), controller 41 proceeds to step S14 to increment "n" by 1 (i.e. n=n+1). Subsequently, in step S15, controller 41 compares "n" with a predetermined constant "K". If the value of "n" is smaller than "K", controller 41 returns step S11 and repeats the steps S11 to S13 to fix the pickup error. In other words, "n" represents the number of retrials consecutively executed for fixing the pickup error. Meanwhile, "K" represents a reference value for judging the presence of serious trouble. For example, a practical value for "K" would be 5 to 10.

When the value of "n" exceeds "K" (i.e. "NO" in step S15), controller 41 judges that the system is encountered with a serious trouble, then moves pickup head 60 to soldering ball container 14 to remove all of soldering balls 1 off (step S16), and then shuts down the system with generation of an alarm (step S17).

On the other hand, if no pickup error is detected ("NO" in step S13), controller 41 proceeds to step S18 to reset the value "n" to 0, and then proceeds to step S19.

In step S19, controller 41 places pickup head 60 and coating head 70 at the second position. Namely, pickup head 60 is positioned above substrate 4 while coating head 70 is positioned above flux storage 16. Then, controller 41 causes pickup head 60 to move in the up-and-down direction to release or transfer soldering balls 1 onto electrodes 5 of substrate 4, while controller 41 causes coating head 70 to move in the up-and-down direction to dip up flux 17 at its pins 73 from flux storage 16. These operations are performed simultaneously; hence, it can bring great improvement in the efficiency of operations.

Next, in step S20, controller 41 causes both heads 60 and 70 to shift in the opposite direction to return both heads 60 and 70 to the first position.

Next, controller 41 makes a judgment in step S21 as to whether any mounting error exists. More specifically, on the way from substrate 4 to soldering ball reservoir 15, pickup head 60 passes over optical unit 80. In this instance, light emitting device 85 and light receiving device 86 cooperatively detect the presence of mounting error as described above.

If any mounting error is detected ("YES" instep S21) controller 41 moves pickup head 60 to soldering ball storage 14 to collect soldering balls 1 trapped in absorbing holes 9 of pickup head 60 (step S22).

Then, controller 41 ends the subroutine of FIG. 17 and returns the main routine of FIG. 15 to perform the steps S4 and S5 to finally form a soldering bump on each electrode 5.

More specifically, after substrate 4 is transported downstream by conveyor 8, controller 41 causes mounting error inspecting station 20 to check the presence of any other mounting error in the same manner as the first embodiment, for the purpose of double checking of mounting error.

Then, the controller 41 causes second mounting section 30 to mount a supplemental soldering ball 1 on the faulty electrode 5 in the same manner as in the first embodiment. After that, controller 41 sends substrate 4 into furnace 40 to melt soldering balls 1 and thereafter cool down the same, thereby forming a soldering bump on each electrode 5.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. An apparatus for mounting electrically conductive balls on a workpiece, comprising:

transporting means for transporting a workpiece in a predetermined transportation direction a workpiece positioning section for positioning said workpiece at a predetermined position;

a ball supplier for supplying electrically conductive balls;

a flux storage for storing flux;

a pickup head for picking up a plurality of electrically conductive balls from said ball supplier and for mounting said plurality of electrically conductive balls on said workpiece placed at said workpiece positioning section;

a flux application head having a plurality of pins at a lower portion thereof for dipping up said flux from said flux storage and applying said flux adhering on said pins to said workpiece placed at said workpiece positioning section; and shifting means for shifting said pickup head and said flux application head in such a manner that said pickup head is positioned above said workpiece positioning section when said flux application head is positioned above said flux storage, and also in such a manner that said flux application head is positioned above said workpiece positioning section when said pickup head is positioned above said ball supplier.

2. The mounting apparatus in accordance with claim 1, further comprising mounting error inspecting means for detecting a presence of mounting error occurring in a mounting operation of said electrically conductive balls by said pickup head.

3. The mounting apparatus in accordance with claim 1, wherein said electrically conductive balls are used for soldering operations.

4. A mounting method for mounting electrically conductive balls on a workpiece, comprising the steps of:

positioning a workpiece at a workpiece positioning section;

dipping up flux from a flux storage by using a plurality of pins of a flux application head;

shifting said flux application head and a pickup head simultaneously in a lateral direction so that said flux application head is positioned above said workpiece placed at said workpiece positioning section and said pickup head is positioned above a ball supplier of electrically conductive balls;

lowering said flux application head onto said workpiece so that said flux adhering on said plurality of pins is applied to said workpiece;

lowering said pickup head to said ball supplier to pick up a plurality of electrically conductive balls by said pickup head;

returning said flux application head and said pickup head simultaneously in an opposite direction so that said flux application head is positioned above said flux storage and said pickup head is positioned above said workpiece on which said flux is applied by said flux application head; and mounting said plurality of electrically conductive balls held by said pickup head onto said workpiece.

5. The mounting method in accordance with claim 4, further comprising a step of inspecting an error of a mounting operation of said electrically conductive balls during a shifting operation of said pickup head moving from said ball supplier to said workpiece.

6. The mounting method in accordance with claim 4, wherein said electrically conductive balls are used for soldering operations.

7. A mounting method for mounting electrically conductive balls on a workpiece, comprising the steps of positioning a workpiece at a workpiece positioning section;

dipping up flux from a flux storage by using a plurality of pins of a flux application head;

shifting said flux application head to a position above said workpiece positioning section and then lowering said flux application head to apply the flux adhering on said plurality of pins to said workpiece, while positioning a pickup head having a plurality of holes to a position above a ball supplier of electrically conductive balls and then lowering said pickup head to pick up said electrically conductive balls;

returning said flux application head to a position above said flux storage and then lowering said flux application head to dip up the flux from said flux storage by using the plurality of pins, while shifting said pickup head to a position above said workpiece positioning section and then lowering said pickup head to mount the electrically conductive balls on said workpiece.

* * * * *